(12) United States Patent
Yanagisawa et al.

(10) Patent No.: US 10,635,051 B2
(45) Date of Patent: Apr. 28, 2020

(54) PORTABLE ELECTRONIC DEVICE

(71) Applicant: SEIKO EPSON CORPORATION, Tokyo (JP)

(72) Inventors: Mitsuto Yanagisawa, Matsumoto (JP); Junya Shibuya, Shiojiri (JP); Keitaro Hashizume, Shiojiri (JP)

(73) Assignee: SEIKO EPSON CORPORATION, Tokyo (JP)

(*) Notice: Subject to any disclaimer, the term of this patent is extended or adjusted under 35 U.S.C. 154(b) by 65 days.

(21) Appl. No.: 15/645,425

(22) Filed: Jul. 10, 2017

(65) Prior Publication Data
US 2018/0032032 A1 Feb. 1, 2018

(30) Foreign Application Priority Data

Jul. 29, 2016 (JP) ................ 2016-149420

(51) Int. Cl.
| | | |
|---|---|---|
| *G04B 37/02* | (2006.01) | |
| *G04G 17/08* | (2006.01) | |
| *G04G 17/04* | (2006.01) | |
| *G04B 47/06* | (2006.01) | |
| *H05K 5/00* | (2006.01) | |
| *H05K 5/02* | (2006.01) | |

(52) U.S. Cl.
CPC ............ *G04B 37/02* (2013.01); *G04B 47/06* (2013.01); *G04G 17/04* (2013.01); *G04G 17/08* (2013.01); *H05K 5/0086* (2013.01); *H05K 5/0213* (2013.01)

(58) Field of Classification Search
CPC ............................. G04B 37/02; H05K 5/0213
See application file for complete search history.

(56) References Cited

U.S. PATENT DOCUMENTS

| | | | | |
|---|---|---|---|---|
| 4,531,308 | A * | 7/1985 | Neilson ................. | B29B 13/065 34/168 |
| 5,943,302 | A * | 8/1999 | Fanshaw ............ | G04B 37/1486 368/276 |
| 6,538,959 | B1 * | 3/2003 | Yamaguchi ............ | G04B 19/12 136/251 |
| 2013/0051198 | A1 * | 2/2013 | Sato ..................... | G04B 19/065 368/235 |
| 2016/0161920 | A1 * | 6/2016 | Fujisawa ................ | G04G 17/04 368/80 |

FOREIGN PATENT DOCUMENTS

| | | |
|---|---|---|
| JP | S56-84341 A | 7/1981 |
| JP | S58-91191 U | 6/1983 |
| JP | S62-130374 A | 6/1987 |
| JP | S62-153790 A | 7/1987 |
| JP | 2005-98990 A | 4/2005 |
| JP | 2007-520377 A | 7/2007 |

* cited by examiner

*Primary Examiner* — Edwin A. Leon
*Assistant Examiner* — Jason M Collins
(74) *Attorney, Agent, or Firm* — Oliff PLC

(57) ABSTRACT

A portable electronic device (wrist device) includes: a case (top case and bottom case); a display unit accommodated in the case; a cover plate closing an opening of the case; and a moisture absorbing member disposed along an outer edge of the display unit between the cover plate and the display unit.

15 Claims, 10 Drawing Sheets

PORTABLE ELECTRONIC DEVICE

CROSS-REFERENCE TO RELATED APPLICATIONS

The current application claims priority to Japanese patent application No. 2016-149420 filed on Jul. 29, 2016, which is incorporated herein by reference in its entirety.

BACKGROUND

1. Technical Field

The present invention relates to a portable electronic device.

2. Related Art

In recent years, many wrist watch-type activity meters have been commercialized as one example of portable electronic devices by manufactures with improved sensing technology. For example, JP-A-2005-98990 discloses, as the wrist watch-type activity meter, an electronic timepiece that is worn on a site (subject) such as the wrist with a band or the like, includes a display unit of digital display, and is capable of wireless communication.

In the wrist watch-type activity meter described above, the inner surface of the display unit or a cover plate fogs up due to, for example, the influences of the moisture in the wrist watch-type activity meter and the outside air temperature, which may lead to a reduction in display visibility. As measures against such fogging, JP-A-56-84341 discloses to bond a film having moisture absorbency to the inner surface of a back lid of a case. Moreover, JP-A-62-130374 discloses to make a middle frame, in a case, of an ABS resin containing a superabsorbent polymer.

However, various electronic components, boards, and the like are accommodated at high density in the wrist watch-type activity meter (one example of portable electronic devices); therefore, the means of absorbing moisture described above have a problem of failing to obtain a sufficient antifogging effect because, for example, the distance from the arrangement position of the moisture absorbing member to the cover plate for which a fogging phenomenon is a problem is increased, or the path (ventilation channel) is lengthened.

SUMMARY

An advantage of some aspects of the invention is to solve at least a part of the problems described above, and the invention can be implemented as the following forms or application examples.

Application Example 1

A portable electronic device according to this application example includes: a case; a display unit accommodated in the case; a cover plate closing an opening of the case; and a moisture absorbing member disposed along an outer edge of the display unit between the over plate and the display unit.

According to this application example, the moisture in the space between the cover plate and the display unit can be more effectively absorbed by the moisture absorbing member disposed between the cover plate and the display unit, in other words, in the space nearest to the cover plate on which a fogging phenomenon occurs, that is, in a position in which a distance from the moisture absorbing member to the cover plate is short, and an excellent antifogging effect on the cover plate can be provided.

Application Example 2

In the portable electronic device according to the application example, it is preferable that the moisture absorbing member has a ring shape.

According to this application example, since the moisture absorbing member having a ring shape is disposed along the outer edge of the display unit, it is possible to dispose the moisture absorbing member without impairing the visibility or designability of the display unit.

Application Example 3

In the portable electronic device according to the application example, it is preferable that the moisture absorbing member includes a display of at least any of a character, a symbol, a scale, and a pattern on a surface on the cover plate side.

According to this application example, by providing the display on the surface of the moisture absorbing member on the cover plate side, it is possible to provide a character, a symbol, a scale, a pattern, and the like, which are functionally useful, and improve designability such as, for example, changing a color tone.

Application Example 4

In the portable electronic device according to the application example, it is preferable that the moisture absorbing member includes a base layer on a front surface on the cover plate side, and that the display is located on a front surface of the base layer on the cover plate side.

According to this application example, by providing the base layer, it is possible to improve the visibility of the display disposed on the front surface of the base layer, or improve designability such as applying various color schemes to the base layer.

Application Example 5

In the portable electronic device according to the application example, it is preferable that at least any of the display and the base layer is formed by an inkjet method.

According to this application example, by the use of an inkjet method, the display or the base layer can be easily disposed even when the moisture absorbing member has irregularities on the front surface.

Application Example 6

In the portable electronic device according to the application example, it is preferable that the portable electronic device further includes a parting plate having a ring shape disposed along the outer edge of the display unit between the cover plate and the display unit, and that the moisture absorbing member is located on the display unit side of the parting plate.

According to this application example, since the moisture absorbing member is disposed on the display unit side of the parting plate, a region of the moisture absorbing member that can be visually recognized from the cover plate side can be reduced. Hence, it is possible to improve designability without reducing moisture absorbency.

Application Example 7

In the portable electronic device according to the application example, it is preferable that the moisture absorbing member is disposed so as to overlap the parting plate in a plan view.

According to this application example, since the parting plate is disposed to overlap the moisture absorbing member in the plan view, the arrangement position can be easily determined.

Application Example 8

In the portable electronic device according to the application example, it is preferable that the parting plate has a light transmissive property.

According to this application example, since the parting plate has a light transmissive property, the moisture absorbing member side can be visually recognized from the cover plate side through the parting plate.

Application Example 9

In the portable electronic device according to the application example, it is preferable that a display of at least any of a character, a symbol, a scale, and a pattern is located on a surface of the parting plate on the display unit side.

According to this application example, by providing the display by back side printing, the display and the like are not exposed on the front side of the parting plate and therefore less likely to be scratched. Moreover, it is possible to provide a character, a symbol, a scale, a pattern, and the like, which are functionally useful, or improve designability such as changing a color tone.

Application Example 10

In the portable electronic device according to the application example, it is preferable that printing is performed on an entire surface of the parting plate on the display unit side so as to cover the display.

According to this application example, since printing is performed so as to cover the display, it is possible to improve the visibility of the display, or improve designability such as applying various color schemes to the entire-surface printing covering the display.

Application Example 11

In the portable electronic device according to the application example, it is preferable that the parting plate is made of a resin.

According to this application example, the parting plate made of, for example, a resin can be molded and cured by ultraviolet rays or the like. The molding of the parting plate can be easily performed as described above, and it is possible to easily respond to the diversification of designs.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments will be described. The embodiments described below do not unduly limit the details of the invention set forth in the appended claims. Moreover, not all of the configurations described in the embodiments are indispensable configuration requirements of the invention.

First Embodiment

Figure 1:
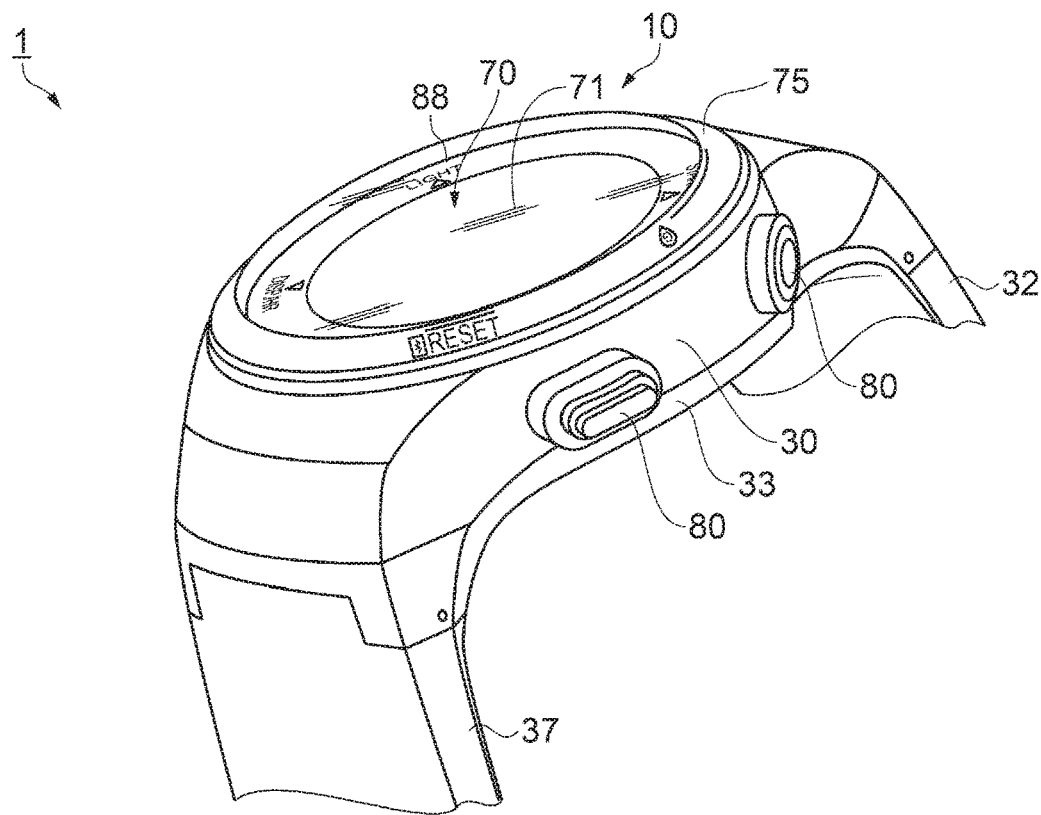
FIG. 1 is a perspective view of the front surface side of a wrist device according to a first embodiment of a portable electronic device.
Figure 2:
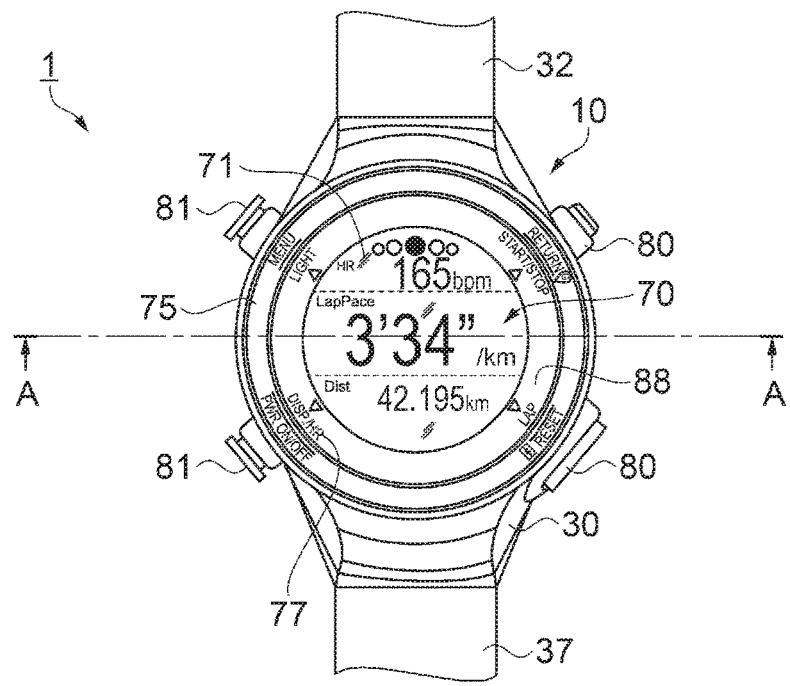
FIG. 2 is a plan view of the wrist device according to the first embodiment.

First, an overview of a wrist device according to a first embodiment of a portable electronic device according to the invention will be described with reference to FIGS. 1 and 2. FIG. 1 is a perspective view of the front surface side of the wrist device according to the first embodiment of the portable electronic device. FIG. 2 is a plan view of the wrist device according to the first embodiment. In the specification, the cover plate side of the wrist device may be described as the front (front side) while the side thereof (the side in contact with the user when the user wears the wrist device) opposite to the cover plate may be described as the back (back side) for convenience of description in the first embodiment and a second embodiment. The wrist device according to the first embodiment can be widely applied to a runners' watch, a runners' watch provided for multi-sports such as a duathlon or a triathlon, a GPS watch equipped with a satellite positioning system, for example, a GPS, and the like.

As shown in FIGS. 1 and 2, the wrist device 1 as one example of the portable (wearable) electronic device is worn on a given site (e.g., the wrist) of the user (wearer), and can detect position information, exercise information, or the like of the user. The wrist device 1 includes a device main body 10 that is worn by the user and detects position information, exercise information, or the like, and a first band portion 32 and a second band portion 37 that are attached to the device main body 10 and used for wearing the device main body 10 by the user. The wrist device 1 can be provided with the function of, for example, detecting biological information such as pulse wave information and the function of obtaining time-of-day information or the like, in addition to the position information or exercise information of the user.

In the device main body 10, a bottom case 33 as a case is disposed on the side to be worn on the user, and a top case 30 as a case including an opening 40 (see FIG. 3) opened on the front side is disposed on the side opposite to the side to be worn on the user. The bottom case 33 and the top case 30 constitute a case. A bezel 75 is provided outside the opening 40 located on the front side (the top case 30) of the device main body 10, and a cover plate (glass plate in the example) 71 as a top portion (external wall) that is disposed to be arranged with the bezel 75 and protects the internal structure is provided inside the bezel 75. The cover plate 71 is disposed so as to close the opening 40 of the top case 30. A plurality of operating buttons 80 and 81 are provided on the side surface of the device main body 10 on the front side (the top case 30). A display that can be visually recognized from the front side can be provided on the bezel 75.

The device main body 10 includes a display unit 70 composed of a liquid crystal display (LCD) or the like disposed directly below the cover plate 71 and a moisture absorbing member 88 disposed between the cover plate 71 at the outer edge portion of the cover plate 71 and the display unit 70. A display that can be visually recognized from the front side can be provided on the moisture absorbing member 88. The device main body 10 may be configured such that the user can view, through the cover plate 71, the display of the display unit 70 or the display of the moisture absorbing member 88. That is, the wrist device 1 of the embodiment may display various kinds of information such as the detected position information or exercise information, or the time-of-day information on the display unit 70, and present the display from the top side of the device main body 10 to the user. A pair of band attaching portions (not shown) that are connection portions to the first band portion 32 and the second band portion 37 are provided on both sides of the bottom case 33.

The cover plate 71 at the top portion of the device main body 10 is not limited to a glass plate but may be a material other than glass, such as a transparent plastic, as long as the material is a transparent member through which the display unit 70 can be viewed and which is a member having a strength to such an extent that can protect the configurations, such as the liquid crystal display (LCD) constituting the display unit 70, accommodated in the interior (an interior space 36 shown in FIG. 4) between the top case 30 and the bottom case 33.

Figure 3:
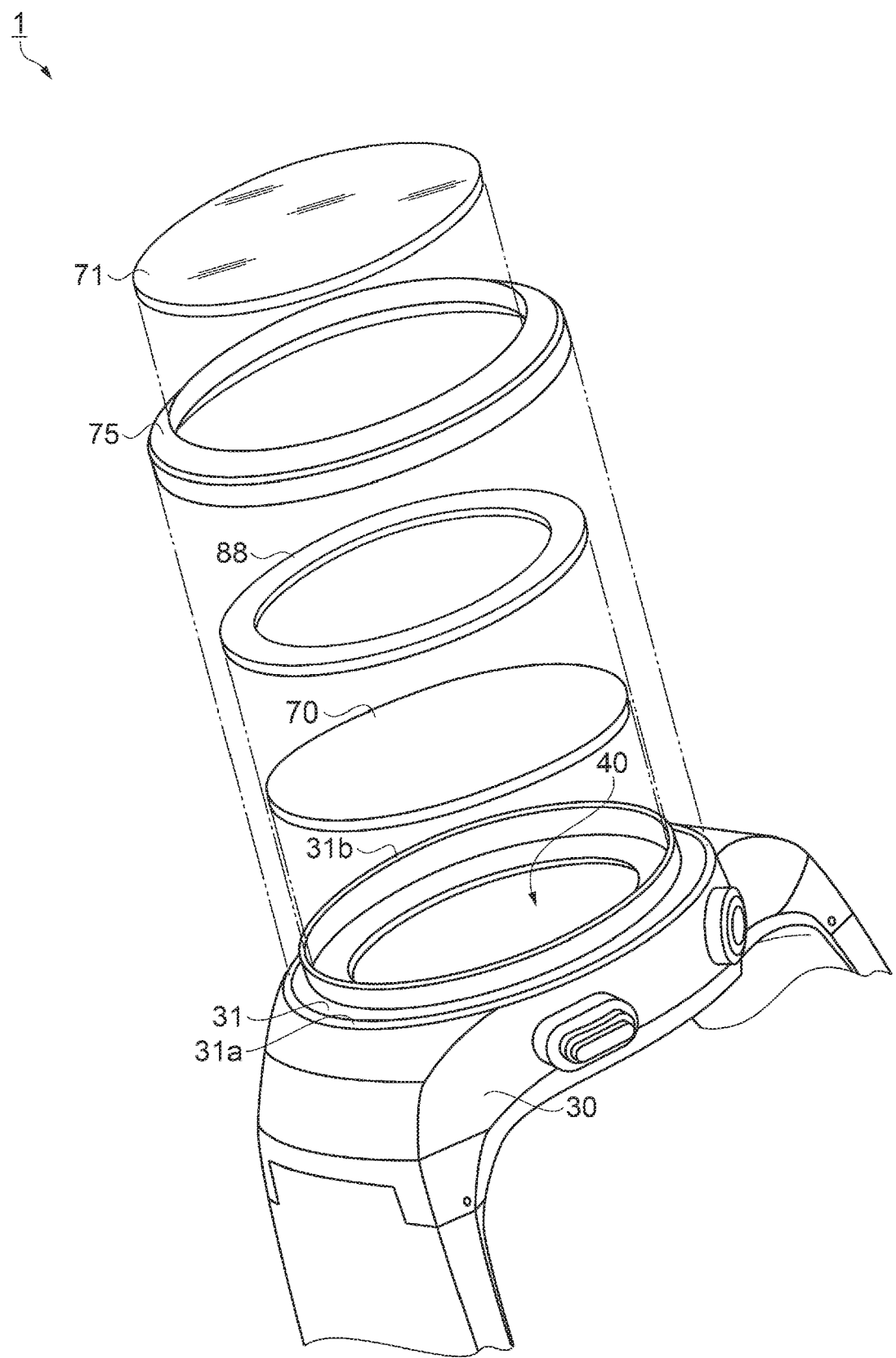
FIG. 3 is an exploded perspective view showing a schematic configuration of the wrist device according to the first embodiment.
Figure 4:
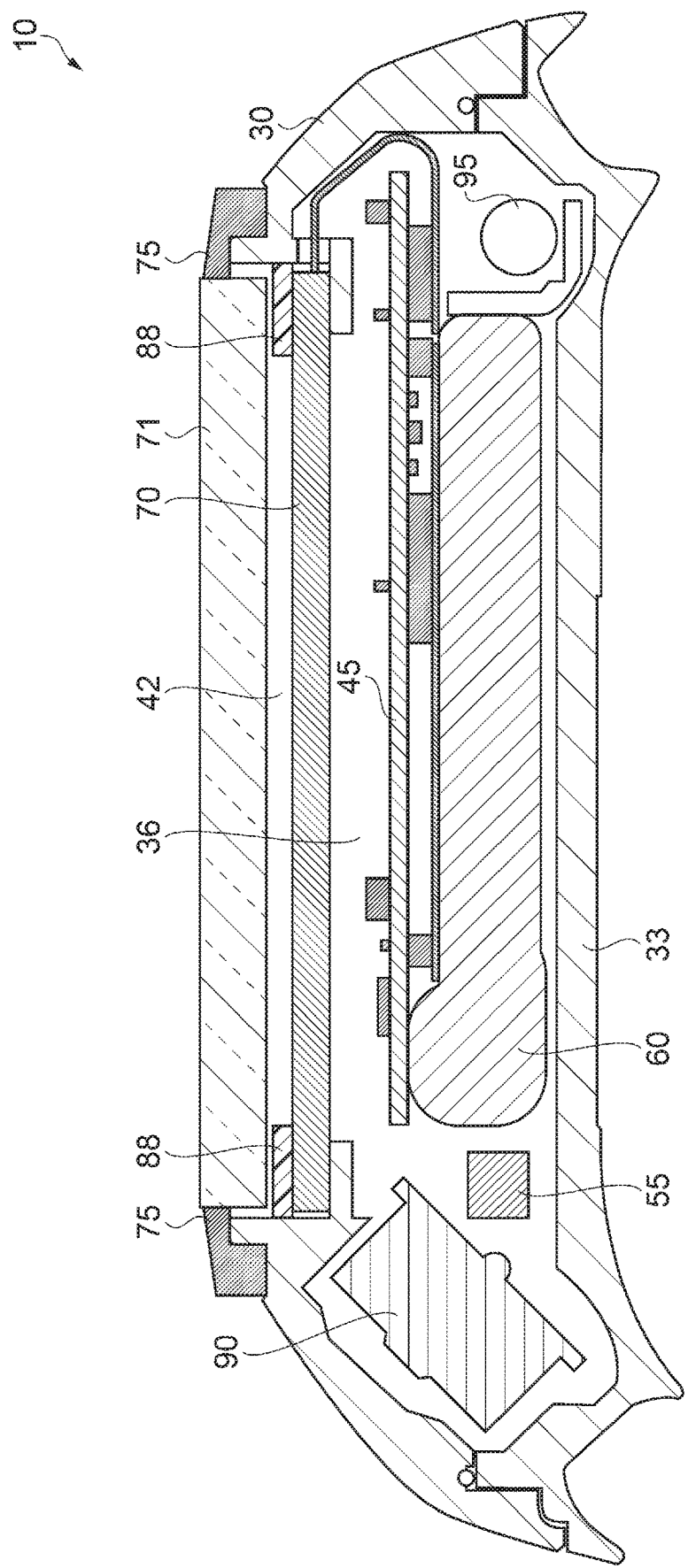
FIG. 4 is a cross-sectional view along line A-A in FIG. 2, showing a schematic configuration of the wrist device according to the first embodiment.
Figure 5A:
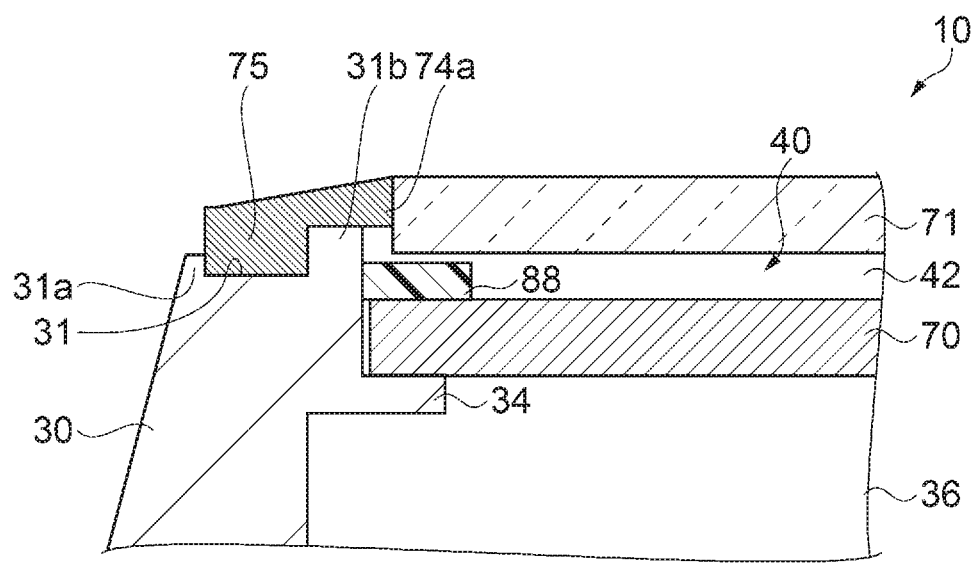
FIG. 5A is a partial enlarged view of FIG. 4.

Next, a configuration example of the cross-sectional structure of the device main body 10 will be described with reference to FIGS. 3, 4, and 5A. FIG. 3 is an exploded perspective view showing a schematic configuration of the wrist device according to the first embodiment. FIG. 4 is a cross-sectional view along line A-A in FIG. 2, showing a schematic configuration of the wrist device according to the first embodiment. FIG. 5A is a partial enlarged view of FIG. 4, showing a schematic configuration of the wrist device according to the first embodiment.

As shown in FIGS. 3, 4, and 5A, the device main body 10 is provided with the interior space 36 as a hermetically sealed space surrounded by the top case 30, the bottom case 33 (see FIG. 1), and the cover plate 71 closing the opening 40 of the top case 30. The display unit 70 and the moisture absorbing member 88 are disposed in the interior space 36. Further, as shown in FIG. 4, for example a circuit board 45, a GPS (Global Positioning System) antenna 90, a geomagnetic sensor 55 as one example of a sensor, a secondary battery 60, a vibrating portion 95, and the like, which are element components constituting the wrist device 1, are accommodated in the interior space 36. However, the device main body 10 is not limited to the configuration shown in FIG. 4, and other sensors such as, for example, a barometric pressure sensor, an electronic component, or the like may be added.

As shown in FIG. 5A, the display unit 70 is placed on a projecting portion 34 projecting to the inside of the top case 30 in the device main body 10. Since the display unit 70 is placed on the projecting portion 34, a space 42 surrounded by the top case 30, the display unit 70, and the cover plate 71 is provided. The moisture absorbing member 88 as a plate member having a ring shape is placed along a second wall portion 31b of the top case 30 on the front side of the display unit 70. In other words, the moisture absorbing member 88 is disposed along the outer edge of the display unit 70 in the space 42 between the cover plate 71 and the display unit 70.

As described above, the moisture absorbing member 88 having a ring shape is disposed between the cover plate 71 and the display unit 70, that is, in the space nearest to the cover plate 71 on which a fogging phenomenon occurs, in other words, in a position in which the distance from the moisture absorbing member 88 to the cover plate 71 is short. Therefore, the moisture in the space 42 in the vicinity of the cover plate 71 can be more effectively absorbed, and an excellent antifogging effect on the cover plate 71 can be provided. Moreover, since the moisture absorbing member 88 having a ring shape is disposed along the outer edge of the display unit 70, it is possible to dispose the moisture absorbing member 88 without impairing the visibility or designability of the display unit 70.

The moisture absorbing member 88 can be configured of, for example, a material containing a polyacrylate fiber. The moisture absorbing member 88 can be formed by, for example, molding a thin plate containing a polyacrylate fiber and having a thickness t of approximately 2.0 mm into a ring shape. The moisture absorbing member 88 can absorb the moisture in the space 42 and the interior space 36 and can lower the humidity in the space 42 and the interior space 36 to a humidity at which dew condensation is less likely to occur. Since the space 42 and the interior space 36 are a hermetically sealed space, the state of humidity at which dew condensation is less likely to occur can be maintained.

Figure 5B:
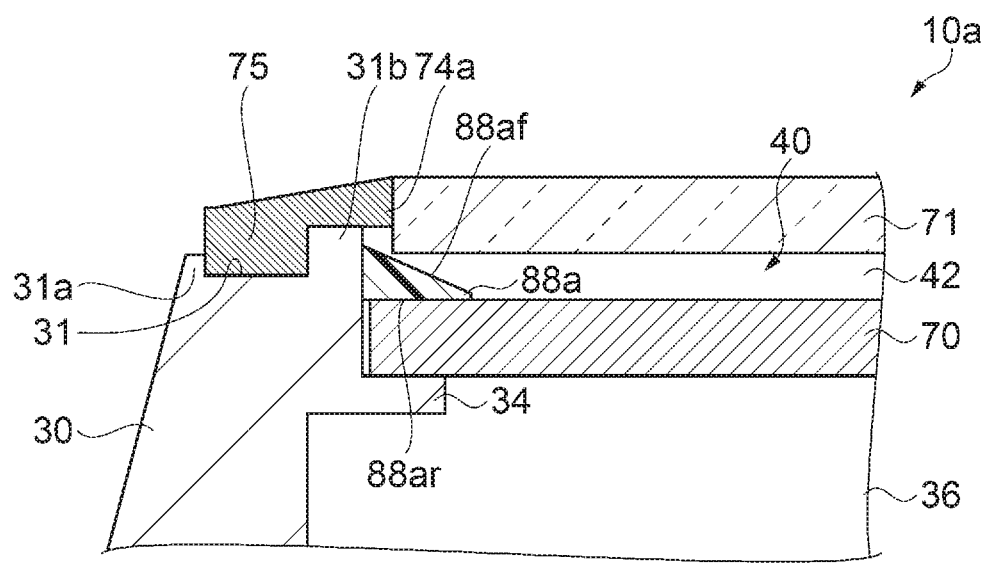
FIG. 5B shows a modified example of a moisture absorbing member having a ring shape and is a partial enlarged view corresponding to FIG. 4.

The moisture absorbing member 88 is not limited to the flat ring shape shown in FIG. 5A. FIG. 5B shows a modified example of the moisture absorbing member. A moisture absorbing member 88a according to a device main body 10a of the modified example may have a cross-sectional shape in which a front surface 88af is an inclined surface inclined with respect to a back surface 88ar on the display unit 70 side as shown in FIG. 5B. In the modified example, the front surface 88af is a surface inclined toward the central side (the inside of the ring) of the ring. In other words, the moisture absorbing member 88a is configured to have a ring shape whose thickness increases toward the outer circumferential side of the ring.

Figure 6:
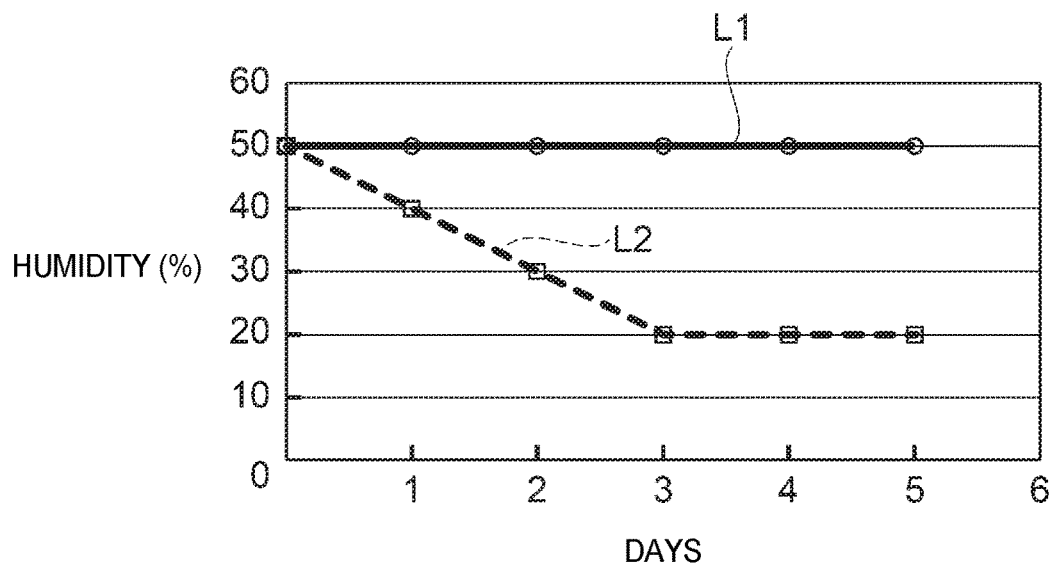
FIG. 6 is a graph showing a moisture absorbing effect of a moisture absorbing member.

Results of examining the moisture absorbing effect of the moisture absorbing member 88 are shown on the graph in FIG. 6. FIG. 6 is the graph showing the moisture absorbing effect of the moisture absorbing member. Specifically, FIG. 6 shows results obtained by putting a thin plate having moisture absorbency and containing a polyacrylate fiber having a volume of approximately 45 mm$^3$ into a hermetically sealed space having a volume of approximately 17 ml, and plotting changes in humidity in the space on a time-series basis. The hermetically sealed space having a volume of approximately 17 ml was set so as to have substantially the same volume as the volume of the interior space 36 surrounded by the top case 30, the bottom case 33, and the cover plate 71 of the embodiment. As shown on the graph of FIG. 6, it can be seen that the humidity is gradually lowered with time after the thin plate having moisture absorbency is put, the humidity is lowered to 20% after three days of putting the thin plate, and thereafter this humidity is maintained. It is said that dew condensation is less likely to occur when humidity is at 30% or less. When a humidity of approximately 20% can be maintained as shown by the examined results, the occurrence of dew condensation can be sufficiently suppressed.

Here, the solid line L1 on the graph shows humidity changes (constant with no change) in the state where the thin plate having moisture absorbency is absent in the hermetically sealed space while the dotted line L2 shows humidity changes in the state where the thin plate having moisture absorbency is put into the hermetically sealed space.

Figure 7A:
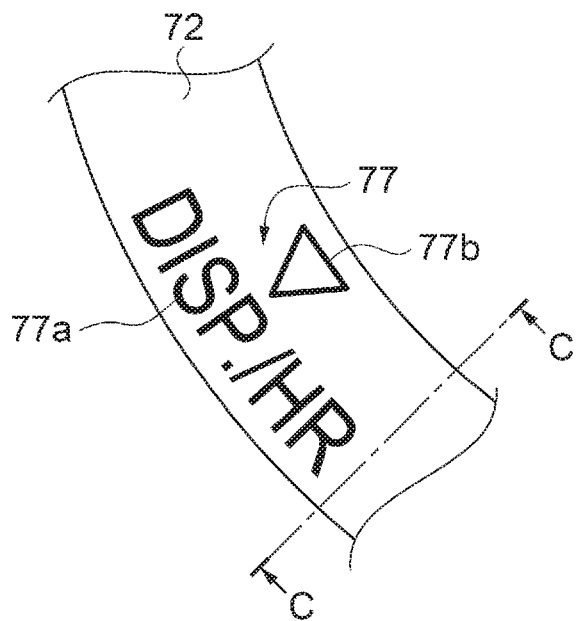
FIG. 7A is a partial plan view showing a display example on a moisture absorbing member having a ring shape according to the first embodiment.
Figure 7B:
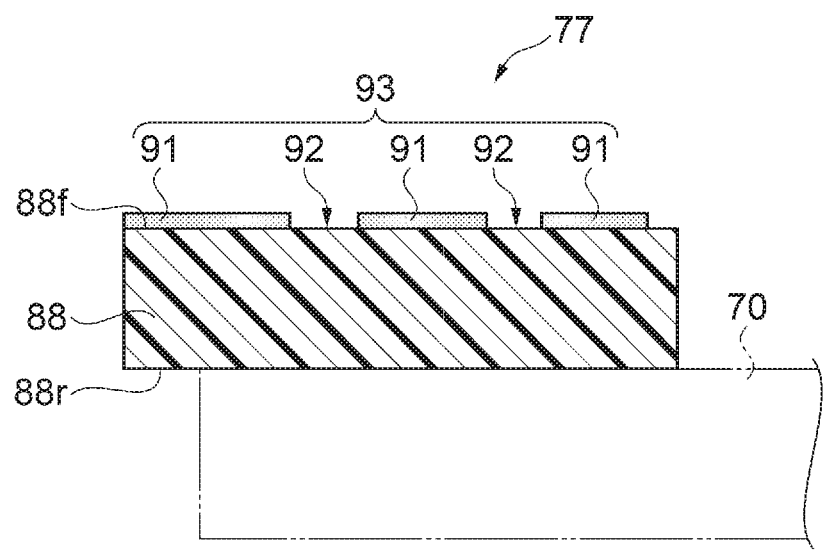
FIG. 7B is a partial cross-sectional view showing the display example on the moisture absorbing member having a ring shape.

As shown in FIG. 7A, a display 77 such as, for example, a character 77a or a symbol 77b can be provided on the cover plate 71 side of the moisture absorbing member 88. Here, the display 77 arranged on the moisture absorbing member 88 will be described with reference to FIGS. 7A and 7B. FIG. 7A shows a display example on the moisture absorbing member of the wrist device according to the first embodiment and is a partial plan view of a portion of the moisture absorbing member as viewed from the front side. FIG. 7B is a cross-sectional view along line C-C in FIG. 7A, showing the moisture absorbing member.

As shown in FIGS. 7A and 7B, the display 77 is provided on a front surface 88f, on the cover plate 71 side, of the moisture absorbing member 88 placed on the display unit 70 with aback surface 88r directed thereto. The display 77 can include, for example, the character 77a, the symbol (pictogram) 77b, and a scale (not shown). It is sufficient that the display 77 is provided with at least any of the character 77a, the symbol (pictogram) 77b, and the scale (not shown). Moreover, the display 77 may be changed in color tone or form a pattern.

By providing the display 77 on the front surface 88f of the moisture absorbing member 88 on the cover plate 71 side, the character 77a, the symbol (pictogram) 77b, a scale or pattern (not shown), and the like, which are functionally useful, can be provided, and it is possible to improve designability such as, for example, changing the color tone.

The display 77 can be formed using, for example, an inkjet method or the like. The display 77 can be expressed by a display pattern 93 including an application portion 91 at which ink is ejected and an exposed portion 92 of the front surface 88f of the moisture absorbing member 88. When the display 77 is formed using an inkjet method, the display can be easily disposed even when the moisture absorbing member 88 has irregularities on the front surface.

Figure 7C:
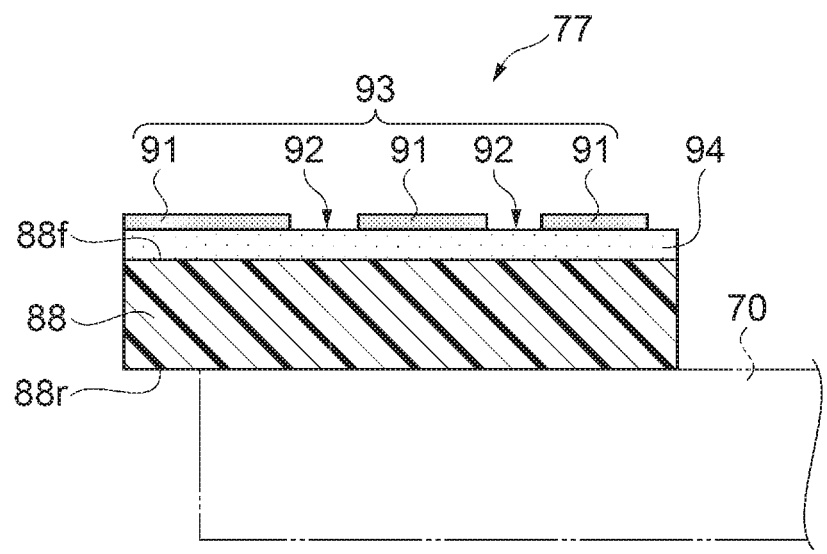
FIG. 7C is a partial cross-sectional view showing a modified example of a display on the moisture absorbing member having a ring shape.

As in a modified example of the display shown in FIG. 7C, the display 77 can be provided with a base layer 94 on the front surface 88f of the moisture absorbing member 88 on the cover plate 71 side. FIG. 7C is a partial cross-sectional view showing the modified example of the display on the moisture absorbing member having a ring shape.

As shown in FIG. 7C, the base layer 94 is provided on the front surface 88f of the moisture absorbing member 88 on the cover plate 71 side. The display 77 is provided on the surface of the base layer 94 on the side opposite to the display unit 70. The configuration of the display 77 is similar to that described above; therefore, a detailed description thereof is omitted herein. It is preferable that the base layer 94 is formed using an inkjet method or the like similarly to the above.

By providing the base layer 94 on the front surface 88f of the moisture absorbing member 88 on the cover plate 71 side as described above, it is possible to improve the visibility of the display 77 disposed on the front surface of the base layer 94 or improve designability or fashionability such as applying various color schemes to the base layer 94. Moreover, by providing the base layer 94 on the front surface 88f of the moisture absorbing member 88, irregularities on the front surface 88f of the moisture absorbing member 88 can be eliminated to thereby make the front surface 88f similar to a smooth surface, and thus it is also possible to provide the display pattern 93 that conveys a sense of luxury.

Returning to FIGS. 4 and 5A, for example, position information using a GPS or a geomagnetic sensor, exercise information such as the amount of movement or the amount of exercise using an angular velocity sensor, an acceleration sensor, or the like, biological information such as a pulse rate using a pulse wave sensor, or the time-of-day information such as the current time is displayed according to various detection modes on the liquid crystal display (LCD) constituting the display unit 70. The user can view (visually recognize) this display through the cover plate 71.

Moreover, the device main body 10 includes a recessed portion 31 having an annular shape located on the outer edge side of the top case 30 and opened toward the front side. A wall portion is configured on the outer circumferential side and the inner circumferential side of the recessed portion 31. The wall portion includes a first wall portion 31a provided on the outer circumferential side and the second wall portion 31b provided on the inner circumferential side. At least a portion of the bezel 75 is inserted into and fixed to the recessed portion 31. By inserting the bezel 75 into the recessed portion 31 as described above, alignment of the bezel 75 with the top case 30 can be easily performed.

The bezel 75 includes an eaves portion 74a protruding to the cover plate 71 side. The eaves portion 74a may abut on the top of the second wall portion 31b on the inner circumferential side of the top case 30. Since the eaves portion 74a abuts on the top of the second wall portion 31b of the top case 30, deformation of the eaves portion 74a can be reduced. The bezel 75 can be formed of a material obtained by subjecting the surface of, for example, a stainless steel material or brass material to a plating process.

The cover plate 71 is disposed so as to be arranged with the bezel 75 on the inner circumferential surface (inside surface) side of the eaves portion 74a of the bezel 75. The cover plate 71 is disposed so as to abut on the inside surface of the eaves portion 74a of the bezel 75. The cover plate 71 is held by the bezel 75 such that the cover plate 71 does not fall off from the device main body 10 (the top case 30). Although the configuration of providing the gap between the cover plate 71 and the moisture absorbing member 88 is shown in the embodiment, the cover plate 71 may be disposed in the state of contacting the moisture absorbing member 88 without providing the gap between the cover plate 71 and the moisture absorbing member 88.

According to the wrist device 1 according to the first embodiment described above, the moisture absorbing member 88 is disposed between the cover plate 71 and the display unit 70, that is, in the space nearest to the cover plate 71 on which a fogging phenomenon occurs. In other words, the moisture absorbing member 88 is disposed in the position in which the distance from the moisture absorbing member 88 to the cover plate 71 is short; therefore, the moisture in the space 42 in the vicinity of the cover plate 71 can be more effectively absorbed, and an excellent antifogging effect on the cover plate 71 can be provided.

Moreover, since the moisture absorbing member 88 having a ring shape provided with the display 77 such as the character 77a or the symbol (pictogram) 77b on the front surface 88f on the cover plate 71 side is disposed along the outer edge of the display unit 70, it is possible to provide the wrist device 1 excellent in the visibility of the display unit 70 and designability or fashionability.

Second Embodiment

Figure 8:
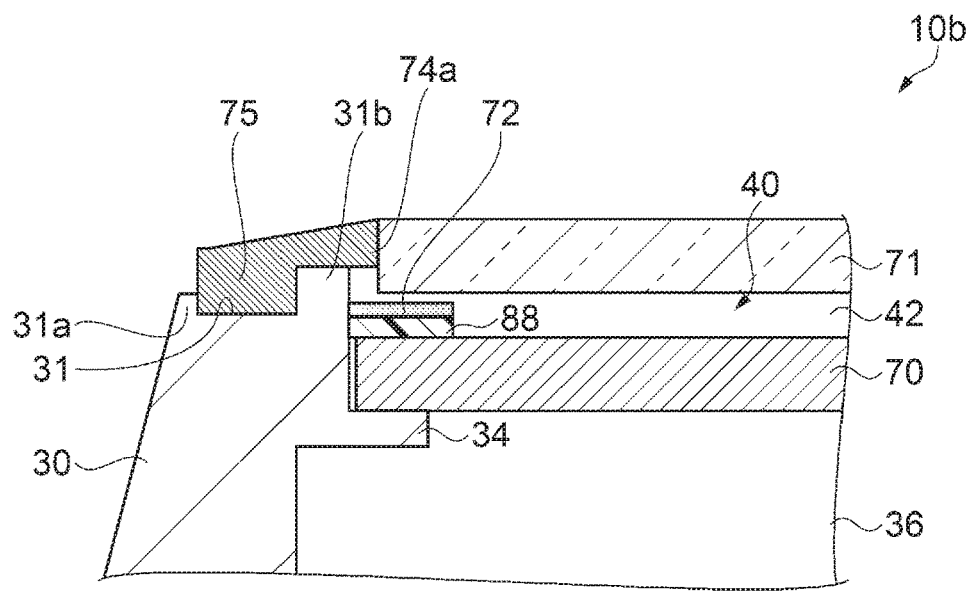
FIG. 8 shows a schematic configuration of a wrist device according to a second embodiment and is a partial cross-sectional view corresponding to the cross-section A-A in FIG. 2.
Figure 9A:
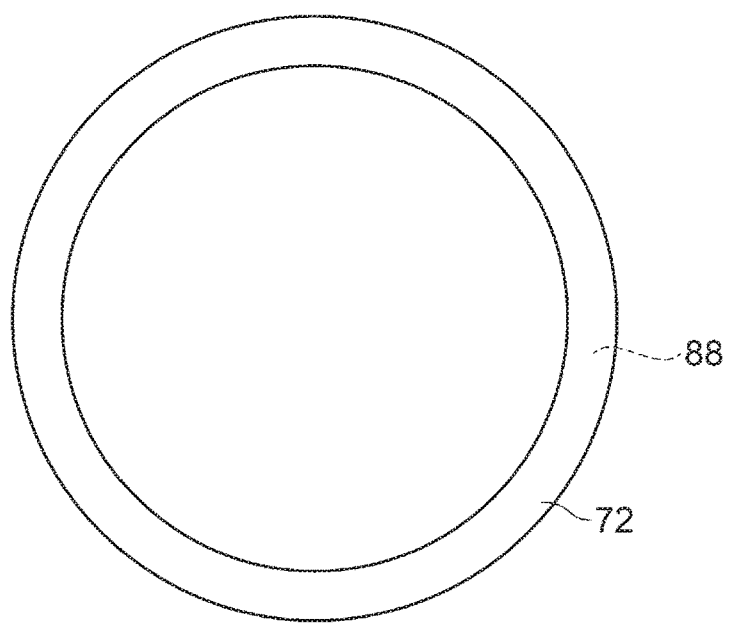
FIG. 9A is a plan view showing the configuration of a parting plate and a moisture absorbing member according to the second embodiment.
Figure 9B:
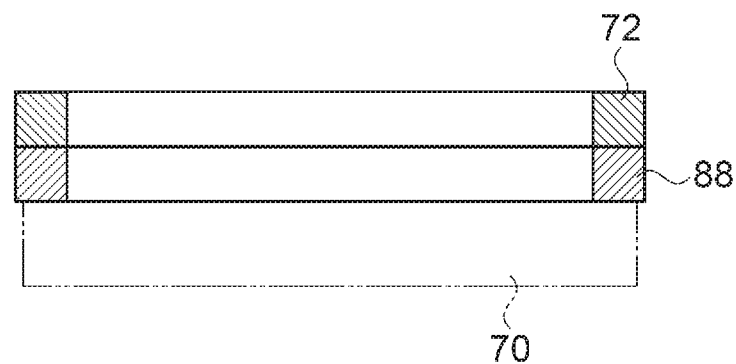
FIG. 9B is a front cross-sectional view showing the configuration of the parting plate and the moisture absorbing member.

Next, the configuration of a wrist device according to a second embodiment of the portable (wearable) electronic device according to the invention will be described with reference to FIGS. 8, 9A, and 9B. FIG. 8 shows a schematic configuration of a device main body of the wrist device according to the second embodiment and is a partial cross-sectional view corresponding to the cross-section A-A in FIG. 2. FIG. 9A is a plan view showing the configuration of a parting plate and a moisture absorbing member according to the second embodiment. FIG. 9B is a front cross-sectional view showing the configuration of the parting plate and the moisture absorbing member. In the following description, configurations similar to those of the first embodiment described above are denoted by the same reference numerals and signs, and the description of the configurations may be omitted.

Compared to the device main body 10 of the first embodiment described above, a device main body 10b of the wrist device according to the second embodiment of the portable (wearable) electronic device differs from the device main body 10 in the configuration relating to the moisture absorbing member 88 disposed between the display unit 70 and the cover plate 71 shown in FIG. 5A. Other configurations of the device main body 10b are similar to those of the device main body 10.

As shown in FIG. 8, the device main body 10b is provided with the interior space 36 as a hermetically sealed space surrounded by the top case 30, the bottom case 33 (see FIG. 1), and the cover plate 71 closing the opening 40 of the top case 30. The display unit 70, a parting plate 72, and the moisture absorbing member 88 are disposed in the interior space 36. Further, the element components constituting the wrist device 1 are accommodated in the interior space 36 as shown in FIG. 4. However, since the element components are similar to those of the first embodiment, the description of the element components is omitted herein.

The display unit 70 is placed on the projecting portion 34 projecting to the inside of the top case 30. For example, position information, exercise information such as the amount of movement or the amount of exercise, biological information such as a pulse rate, or the time-of-day information such as the current time is displayed according to various detection modes on the liquid crystal display (LCD) constituting the display unit 70. The user can view (visually recognize) this display through the cover plate 71.

Moreover, since the display unit 70 is placed on the projecting portion 34, the space 42 surrounded by the top case 30, the display unit 70, and the cover plate 71 is formed. The moisture absorbing member 88 as a plate member having a ring shape as shown in FIGS. 9A and 9B is placed along the second wall portion 31b of the top case 30 on the front side of the display unit 70. In other words, the moisture absorbing member 88 is disposed along the outer edge of the display unit 70 in the space 42 between the cover plate 71 and the display unit 70. As shown in FIG. 9B, the parting plate 72 having a ring shape disposed so as to overlap the moisture absorbing member 88 is placed on the cover plate 71 side (front side) of the moisture absorbing member 88. In other words, the parting plate 72 is disposed along the outer edge of the display unit 70 in the space 42 between the cover plate 71 and the display unit 70.

In the embodiment as described above, the moisture absorbing member 88 is disposed on the display unit 70 side of the parting plate 72. Since the parting plate 72 is disposed to overlap the moisture absorbing member 88 in a plan view, the arrangement position of the parting plate 72 can be easily determined. Moreover, since the moisture absorbing member 88 is disposed on the display unit 70 side of the parting plate 72, a region of the moisture absorbing member 88 that can be visually recognized from the cover plate 71 side can be reduced. Hence, it is possible to improve the designability of a region in which the parting plate 72 and the moisture absorbing member 88 are disposed without reducing moisture absorbency.

The moisture absorbing member 88 can be configured of, for example, a material containing a polyacrylate fiber similarly to the first embodiment. The moisture absorbing member 88 can absorb the moisture in the space 42 and the interior space 36 and can lower the humidity in the space 42 and the interior space 36 to a humidity at which dew condensation is less likely to occur. Since the space 42 and the interior space 36 are a hermetically sealed space, the state of humidity at which dew condensation is less likely to occur can be maintained.

The moisture absorbing member 88 is disposed on the display unit 70 side of the parting plate 72, and the parting plate 72 and the moisture absorbing member 88 are disposed so as to overlap each other. Therefore, a region of the moisture absorbing member 88 that can be visually recognized from the cover plate 71 side is reduced. Hence, it is possible to enhance fashionability while maintaining moisture absorbency.

As shown in the modified example (see FIG. 5B) of the first embodiment, the moisture absorbing member 88 may have a cross-sectional shape in which the front surface on the cover plate 71 side is an inclined surface that is inclined. For example, the front surface may be a surface inclined toward the central side of the ring, in other words, the moisture absorbing member may have a ring shape whose thickness increases toward the outer circumferential side of the ring.

For the parting plate 72, a metal containing, for example, aluminum, stainless steel, brass, or the like as a chief material can be used, or an ultraviolet-curable transparent resin material (member made of a resin) such as, for example, urethane acrylate, acrylic resin acrylate, or epoxy acrylate can be used. Here, when the parting plate 72 is made of a metal, it is possible to convey a sense of luxury of the surroundings of the display unit 70 or increase the strength thereof. Moreover, when the parting plate 72 is made of a resin, the parting plate 72 can be easily molded by molding and curing using, for example, ultraviolet rays or the like, and it is also possible to easily respond to the diversification of designs.

Figure 10A:
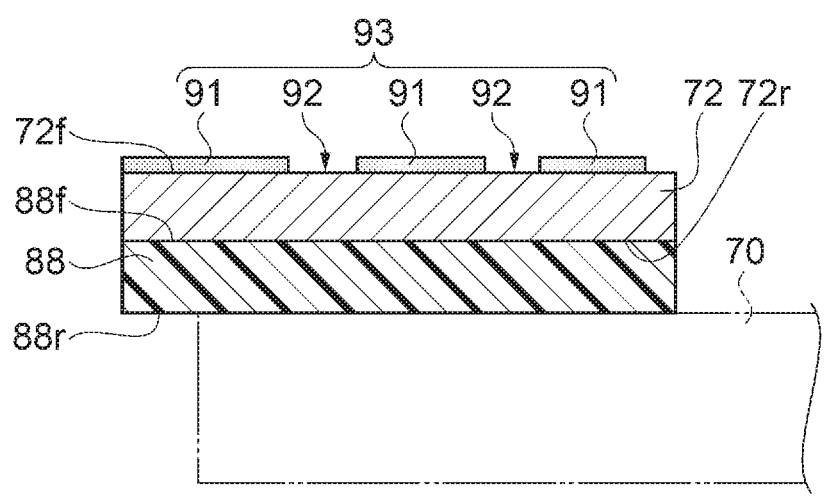
FIG. 10A is a partial cross-sectional view showing Display Example 1 on the parting plate according to the second embodiment.
Figure 10B:
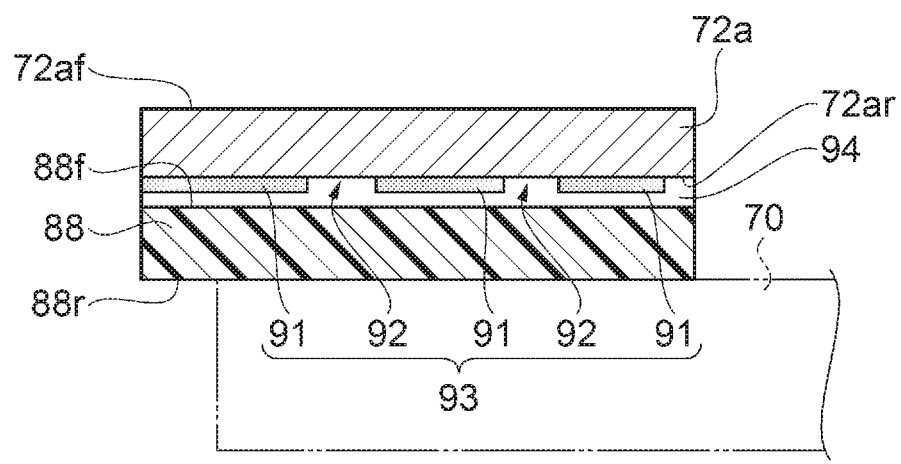
FIG. 10B is a partial cross-sectional view showing Display Example 2 on the parting plate according to the second embodiment.

The display 77 such as, for example, the character 77a or the symbol 77b, like that referred to in the first embodiment described above and shown in FIG. 7A, can be provided on the cover plate 71 side of the parting plate 72. Here, the display 77 arranged on the parting plate 72 will be described with reference to FIGS. 7A, 10A, and 10B. FIG. 10A is a partial cross-sectional view showing Display Example 1 on the parting plate according to the second embodiment. FIG. 10B is a partial cross-sectional view showing Display Example 2 on the parting plate according to the second embodiment. Here, Display Example 1 shown in FIG. 10A illustrates a configuration in which the display 77 is provided on the cover plate 71 side of the parting plate 72. Display example 2 shown in FIG. 10B illustrates a configuration in which the parting plate 72 is configured of a transparent resin material and the display 77 is provided on the moisture absorbing member 88 side of the parting plate 72.

First, the configuration in which the display 77 (see FIG. 7A) is provided on the cover plate 71 side of the parting plate 72 will be described with reference to FIG. 10A. The moisture absorbing member 88 is placed on the display unit 70 with the back surface 88r directed thereto. The parting plate 72 is disposed on the front surface 88f side of the moisture absorbing member 88. The display 77 is provided on a front surface 72f as the surface of the parting plate 72 on the cover plate 71 (see FIG. 8) side. The display 77 can include, for example, the character 77a, the symbol (pictogram) 77b, and a scale (not shown). It is sufficient that the display 77 is provided with at least one of the character 77a, the symbol (pictogram) 77b, and the scale (not shown). Moreover, the display 77 may be changed in color tone or form a pattern.

By providing the display 77 on the front surface 72f of the parting plate 72 on the cover plate 71 side, the character 77a, the symbol (pictogram) 77b, the scale or pattern (not shown), and the like, which are functionally useful, can be provided, and it is possible to improve the designability of the parting plate 72 such as, for example, changing the color tone.

The display 77 can be formed using, for example, a screen printing device, an inkjet method, or the like. The display 77 can be expressed by the display pattern 93 including the application portion 91 at which ink is applied and the exposed portion 92 of the front surface 72f of the parting plate 72. The display 77 can be provided with a base layer (not shown) on the front surface 72f of the parting plate 72. In this case, the base layer is used as a foundation, and the display 77 is disposed on the front surface thereof.

Next, the configuration in which a parting plate 72a is configured of a transparent resin material and the display 77 is provided on the display unit 70 side of the parting plate 72a, that is, on the moisture absorbing member 88 side of the parting plate 72a will be described with reference to FIG. 10B. The moisture absorbing member 88 is placed on the display unit 70 with the back surface 88r directed thereto. The parting plate 72a is disposed on the front surface 88f side of the moisture absorbing member 88. The parting plate 72a is formed of a transparent resin having a light transmitting property, for example, an ultraviolet-curable resin material (member made of a resin) such as urethane acrylate, acrylic resin acrylate, or epoxy acrylate.

By employing the parting plate 72a made of, for example, an ultraviolet-curable resin, the molding of the parting plate 72a can be easily performed, and it is possible to easily respond to the diversification of designs.

The display 77 such as shown in FIG. 7A is provided on a back surface 72ar as the surface of the parting plate 72a on the display unit 70 side. The display 77 can include, for example, the character 77a, the symbol (pictogram) 77b, and a scale (not shown). It is sufficient that the display 77 is provided with at least any of the character 77a, the symbol (pictogram) 77b, and the scale (not shown). Moreover, the display 77 may be changed in color tone or form a pattern. Since the parting plate 72a is made of the resin having a light transmissive property as described above, the display 77 can be visually recognized from a front surface 72af side (the over plate 71 side) of the parting plate 72a even when the display 77 is provided on the back surface 72ar side.

The display 77 can be configured of the display pattern 93 representing the character 77a or the symbol 77b formed using, for example, a back side printing (drawing) method of a screen printing device, an inkjet printer, or the like. The display 77 (the display pattern 93) can also be formed using an etching method. The display pattern 93 includes the application portion 91 formed of, for example, ink or the like and the exposed portion 92 of the back surface 72ar at which the application portion 91 is not formed. The application portion 91 can express a pattern or a color design by changing the color or color tone of ink.

By providing the display 77 on the back surface 72ar of the parting plate 72a by back side printing as described above, the display 77 and the like are not exposed on the front surface 72af side of the parting plate 72a, and therefore, the display 77 and the like are less likely to be scratched. Moreover, it is possible to provide the character 77a, the symbol 77b, a pattern, or the like, which is functionally useful, or improve designability such as changing the color tone.

The base layer 94 may be applied to (printed on) the entire surface of the parting plate 72a on the back surface 72ar side so as to cover the display 77. Since the base layer 94 is applied (printed) so as to cover the display 77 as described above, it is possible to improve the visibility of the display 77 or improve the designability such as applying various color schemes to the application (printing) covering the display 77 over the entire surface on the back surface 72ar side.

The display 77 may be provided, not on the parting plate 72a side, but on the front surface 88f side of the moisture absorbing member 88 on the cover plate 71 side. Moreover, the display 77 may be provided with the base layer 94 on the front surface 88f of the moisture absorbing member 88, and the display pattern 93 may be provided on the front surface of the base layer 94. Also in this case, since the parting plate 72a is made of the resin having a light transmissive property, the display 77 can be visually recognized from the front surface 72*af* side (the cover plate 71 side) of the parting plate 72*a*.

According to the wrist device 1 (the device main body 10*b*) according to the second embodiment described above, the moisture absorbing member 88 disposed to overlap the parting plate 72 or 72*a* is disposed between the cover plate 71 and the display unit 70, that is, in the space nearest to the cover plate 71 on which a fogging phenomenon occurs. With this configuration, similarly to the first embodiment, the moisture in the space 42 in the vicinity of the cover plate 71 can be effectively absorbed, and an excellent antifogging effect on the cover plate 71 can be provided.

Moreover, by disposing the display 77 such as the character 77*a* or the symbol (pictogram) 77*b* on the parting plate 72 or 72*a*, it is possible to provide the wrist device 1 (the device main body 10*b*) excellent in the visibility of the display unit 70 and designability or fashionability.

Moreover, in the configuration described in the second embodiment in which the parting plate 72 having a ring shape is placed so as to overlap the moisture absorbing member 88, the moisture absorbing member disposed on the display unit 70 side of the parting plate 72 having a ring shape may be configured such that the moisture absorbing member is divided into a plurality of parts and disposed.

Figure 11A:
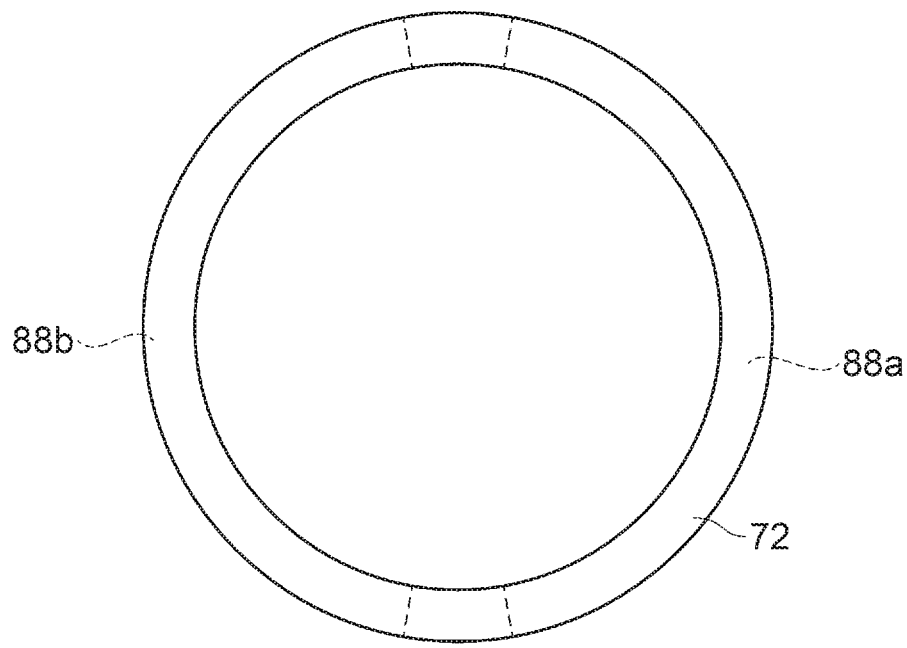
FIG. 11A is a plan view showing a modified example of the configuration of the parting plate and the moisture absorbing member.
Figure 11B:
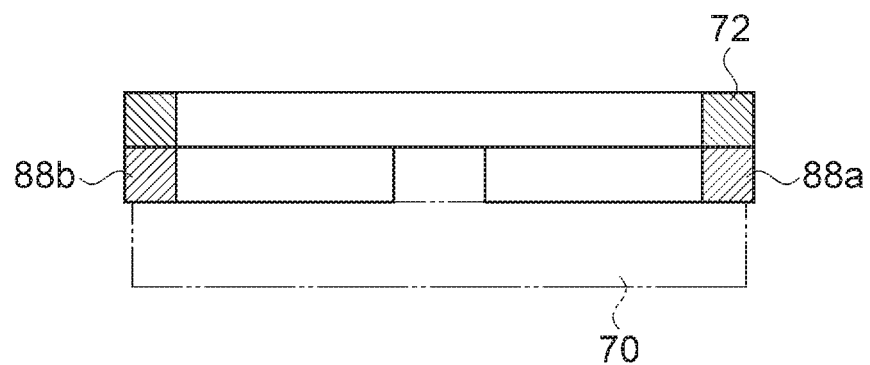
FIG. 11B is a front cross-sectional view showing the modified example of the configuration of the parting plate and the moisture absorbing member.

Hereinafter, a modified example of the moisture absorbing member 88 will be described with reference to FIGS. 11A and 11B. FIG. 11A is a plan view showing the modified example of the configuration of a parting plate and a moisture absorbing member. FIG. 11B is a front cross-sectional view showing the modified example of the configuration of the parting plate and the moisture absorbing member.

As shown in FIGS. 11A and 11B, the moisture absorbing member 88 disposed to overlap the parting plate 72 according to the modified example has a two-piece structure including a first moisture absorbing member 88*a* and a second moisture absorbing member 88*b* separated from each other. The first moisture absorbing member 88*a* and the second moisture absorbing member 88*b* are formed by separating portions from the ring along the circumference similar to the second embodiment. The moisture absorbing member 88 is not limited to the two-piece structure but may be configured of three or more pieces. Even when a plurality of moisture absorbing members, which can be illustrated as the first moisture absorbing member 88*a* and the second moisture absorbing member 88*b*, are disposed, advantageous effects similar to those of the second embodiment can be provided.

Although the wrist device worn on the wrist of the user has been illustrated as the portable electronic device worn on a given site of the user (wearer) in the above description, the following wearing examples can be illustrated. The portable electronic device may be configured, for example, like a necklace hanging around the neck, configured to be worn on the torso, ankle, or the like, or configured to be held in a pocket or bag by the user like a portable information terminal.

Although the description has been made using the GPS (Global Positioning System) as a satellite positioning system, other GNSSs (Global Navigation Satellite Systems) may be used. For example, one of or two or more of satellite positioning systems such as EGNOS (European Geostationary-Satellite Navigation Overlay Service), QZSS (Quasi Zenith Satellite System), GLONASS (GLObal NAvigation Satellite System), GALILEO, and BeiDou (BeiDou Navigation Satellite System) may be used. Moreover, SBAS (Satellite-based Augmentation System) such as WAAS (Wide Area Augmentation System) or EGNOS (European Geostationary-Satellite Navigation Overlay Service) may be used as at least one of the satellite positioning systems.

What is claimed is:

1. A portable electronic device comprising:
   a case including an opening;
   a bezel provided outside the opening of the case;
   a display unit accommodated in the opening of the case;
   a circuit board provided below the display unit and accommodated in the opening of the case;
   a cover plate closing the opening of the case; and
   a moisture absorbing member that is:
   (i) disposed along an outer edge of the display unit such that an outer edge of the moisture absorbing member is further outward than the outer edge of the display unit,
   (ii) disposed between the cover plate and the display unit and spaced apart from the cover plate, and
   (iii) disposed below the bezel such that the outer edge of the moisture absorbing member contacts the case without contacting the bezel.

2. The portable electronic device according to claim 1, wherein
   the moisture absorbing member has a ring shape.

3. The portable electronic device according to claim 1, wherein
   the moisture absorbing member includes a display of at least one of a character, a symbol, a scale, and a pattern on a surface on a cover plate side.

4. The portable electronic device according to claim 3, wherein
   the moisture absorbing member includes a base layer on a front surface of the moisture absorbing member on the cover plate side; and
   the display is located on a front surface of the base layer on the cover plate side.

5. The portable electronic device according to claim 3, wherein
   at least one of the display and a base layer is formed by an inkjet method.

6. The portable electronic device according to claim 1, further comprising:
   a plate having a ring shape disposed along the outer edge of the display unit between the cover plate and the display unit, wherein
   the moisture absorbing member is located on a display unit side of the plate.

7. The portable electronic device according to claim 6, wherein
   the moisture absorbing member is disposed so as to overlap the plate in a plan view.

8. The portable electronic device according to claim 6, wherein
   the plate has a light transmissive property.

9. The portable electronic device according to claim 8, wherein
   a display of at least one of a character, a symbol, a scale, and a pattern is located on a surface of the plate on the display unit side.

10. The portable electronic device according to claim 9, wherein
    a base layer is printed on an entire surface of the plate on the display unit side so as to cover the display.

11. The portable electronic device according to claim 6, wherein
    the plate is made of a resin.

12. The portable electronic device according to claim 1, wherein
the moisture absorbing member is disposed directly on a top surface of the display unit.

13. A portable electronic device comprising:
a case having an opening;
a bezel provided outside the opening of the case;
a display unit accommodated in the opening of the case;
a circuit board provided below the display unit and accommodated in the opening of the case;
a transparent cover closing the opening of the case;
a moisture absorbing member that is:
  (i) disposed along an outer edge of the display unit such that an outer edge of the moisture absorbing member is further outward than the outer edge of the display unit,
  (ii) disposed between the transparent cover and the display unit and spaced apart from the transparent cover, and
  (iii) disposed below the bezel such that the outer edge of the moisture absorbing member contacts the case without contacting the bezel; and
a plate disposed between the transparent cover and the moisture absorbing member.

14. The portable electronic device according to claim 13, wherein
the moisture absorbing member and the plate are ring shaped.

15. The portable electronic device according to claim 13, wherein
the moisture absorbing member is disposed directly on a top surface of the display unit.

* * * * *